(12) United States Patent
Dobbs et al.

(10) Patent No.: US 6,957,544 B2
(45) Date of Patent: Oct. 25, 2005

(54) METHOD AND APPARATUS FOR REGULATING THE OPERATING TEMPERATURE OF ELECTRONIC DEVICES

(75) Inventors: Robert W. Dobbs, Granite Bay, CA (US); Stephan K. Barsun, Davis, CA (US); Andrew H. Barr, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/622,917

(22) Filed: Jul. 18, 2003

(65) Prior Publication Data

US 2005/0011208 A1    Jan. 20, 2005

(51) Int. Cl.$^7$ ............................................. F25D 17/00
(52) U.S. Cl. ..................... 62/178; 62/259.2; 361/696; 361/694; 165/80.3
(58) Field of Search ...................... 62/178, 177, 259.2, 62/404; 165/80.3; 361/696, 694

(56) References Cited

U.S. PATENT DOCUMENTS

| | | | | |
|---|---|---|---|---|
| 4,557,225 A | * | 12/1985 | Sagues et al. ............ | 123/41.31 |
| 5,333,676 A | * | 8/1994 | Mizuno ...................... | 165/294 |
| 5,718,628 A | * | 2/1998 | Nakazato et al. ........... | 454/184 |
| 5,773,755 A | * | 6/1998 | Iwatare .................... | 174/17 VA |
| 6,128,188 A | * | 10/2000 | Hanners .................... | 361/694 |
| 6,412,292 B2 | * | 7/2002 | Spinazzola et al. ............ | 62/89 |
| 6,487,074 B1 | * | 11/2002 | Kimura et al. .............. | 361/695 |

FOREIGN PATENT DOCUMENTS

JP    2000277957 A    * 10/2000    ............ H05K 7/20

* cited by examiner

*Primary Examiner*—Chen Wen Jiang

(57) ABSTRACT

In one embodiment, the present invention recites a temperature control subsystem for use with an air conditioning system. The temperature control subsystem comprises a temperature sensor located in proximity to a heat-generating device disposed within a housing, where the temperature sensor generates data corresponding to the temperature of the heat-generating device. The temperature control subsystem further comprises an air-flow control feature coupled to the housing, whereby the air-flow control feature is configured to regulate the delivery of cooling air to the housing. Cooling air is provided by the air conditioning system. A local control subsystem is coupled to the air-flow control feature to control the air flow of cooling air to the housing so that the air flow is adjustable to correspond to the temperature data received from the temperature sensor.

14 Claims, 6 Drawing Sheets

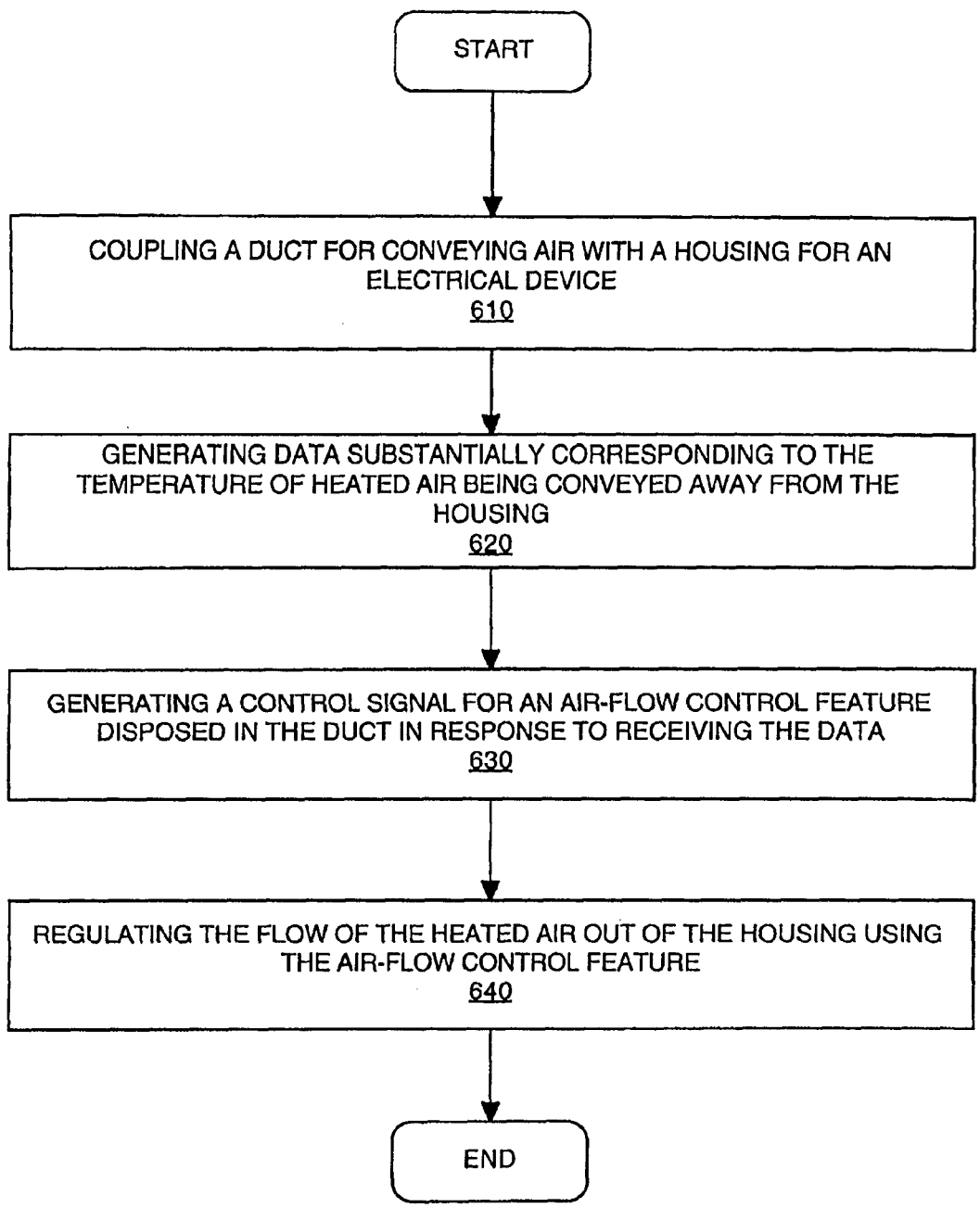

METHOD AND APPARATUS FOR REGULATING THE OPERATING TEMPERATURE OF ELECTRONIC DEVICES

TECHNICAL FIELD

Embodiments of the present invention relate to a method and apparatus for maintaining an appropriate operating temperature for electronic devices.

BACKGROUND ART

Maintaining a relatively constant and appropriate operating temperature and humidity for electronic devices is essential to obtaining a low level of failure rate. Electronic devices such as servers are mounted in rack-mount housings, and are located in suitable rooms which are air-conditioned to maintain a relatively constant temperature and humidity level in the room, and by extension, the servers and/or other electronic devices in the room. Often the rooms containing this equipment are specially designed with raised floors equipped with removable panels that have ports that open to the region beneath the raised floor. This region beneath the floor is used to provide wiring interconnections, power, and is often part of a closed conditioned air delivery system. Cooling air is delivered from the air conditioning system which is typically located elsewhere in the building, to the region underneath the flooring, and from there is guided via the ports in the flooring into the room. Typically, these ports are installed in the aisles between the rack-mount housings so that conditioned air is directed through ports in the front of the rack-mount housing, past the servers, and out into the room, where it is collected and returned to the air conditioning system.

The temperature control system for the room generally consists of a room thermostat housing a temperature sensor and a control input to determine the desired operating temperature for the room. Thus the heat from the servers, other electronics, the lighting, and the personnel in the room create a given heat load for that room, and the thermostat provides regulation at a given point in the room, based on the average heat load for the entire room. The air conditioning system is designed to take a particular heat load from the room based on an aggregate design load level. However, the temperature in the housings of the servers may be significantly higher than the average temperature in the room as measured at the thermostat. Conversely, the temperature in housings with only a few servers may be significantly lower than the average in the room, as determined at the thermostat location. Thus, while the cooling efficiency of system as a whole may be adequate, the temperature variations between individual server racks can result in less than optimal operating temperatures at the location of the server racks. Further, since the cooling air is delivered throughout the room via the ports in the flooring, and only the average temperature is evaluated at the thermostat, it is possible that more cooling air than is needed is being delivered to one server rack, and an insufficient amount is delivered to a server rack that needs it. This further results in a waste of power at the air conditioning system.

FIG. 1 shows an exemplary prior art climate controlled environment for electronic devices, such as servers. In FIG. 1, a room 100 contains a raised false floor 104. The raised false floor, in conjunction with the walls and lower floor of room 100, create an air flow plenum 101. The raised false floor 104 contains ports or openings 103 placed at predetermined locations on the floor throughout the room, through which cooling air 105 flows from an air conditioner 110. Some of the cooling air 105 (shown by arrows 106) passes through ports in heat-producing devices 141 mounted throughout a rack-mount housing 140. There may be any number of such rack-mount housings in a given room. For the sake of clarity, only one such housing 140 is shown in FIG. 1. Each rack-mount housing 140 may contain a full complement of heat-producing devices 141, or any number of such devices, including none. This variation in heat load at each localized housing can result in significantly different temperature conditions in each housing, depending on the size of the housing, the number of devices in the housing, the amount of heat generated by the devices, the volume of air passing through the housing, etc.

The heat from the heat-producing devices 141 dissipates into the cooling air that is drawn into the heat-producing devices 141 and is conducted out of the rack-mount housing 140 as heated air 107. Heated air 107 typically mixes with the cooling air 105 of room 100, thus creating ambient air 109 which is returned for recycling through air conditioner 110. Air conditioner 110 comprises a heat exchanger that removes heat from and dehumidifies the ambient air 109 and re-cycles cooling air 105 into air plenum 101. A thermostat 120 comprising a temperature sensor and a control function for setting a reference temperature for the room. Temperature sensor data and the desired room temperature setting are conveyed via wiring 121 to a master control system 130, which interprets the data and the temperature setting and provides control signals via wiring 131 to air conditioner 110.

DISCLOSURE OF THE INVENTION

In one embodiment, the present invention recites a temperature control subsystem for use with an air conditioning system. The temperature control subsystem comprises a temperature sensor located in proximity to a heat-generating device disposed within a housing, where the temperature sensor generates data corresponding to the temperature of the heat-generating device. The temperature control subsystem further comprises an air-flow control feature coupled to the housing, whereby the air-flow control feature is configured to regulate the delivery of cooling air to the housing. Cooling air is provided by the air conditioning system. A local control subsystem is coupled to the air-flow control feature to control the air flow of cooling air to the housing so that the air flow is adjustable to correspond to the temperature data received from the temperature sensor.

BRIEF DESCRIPTION OF THE DRAWINGS

The accompanying drawings, which are incorporated in and form a part of this specification, illustrate embodiments of the present invention and, together with the description, serve to explain the principles of the invention. Unless specifically noted, the drawings referred to in this description should be understood as not being drawn to scale.

FIG. 6 is a flow chart of a method for controlling the temperature of an electrical device in accordance with embodiments of the present invention.

MODES FOR CARRYING OUT THE INVENTION

Reference will now be made in detail to the preferred embodiments of the invention, examples of which are illustrated in the accompanying drawings. While the invention will be described in conjunction with the preferred embodiments, it is understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail as not to unnecessarily obscure aspects of the present invention.

Figure 1:
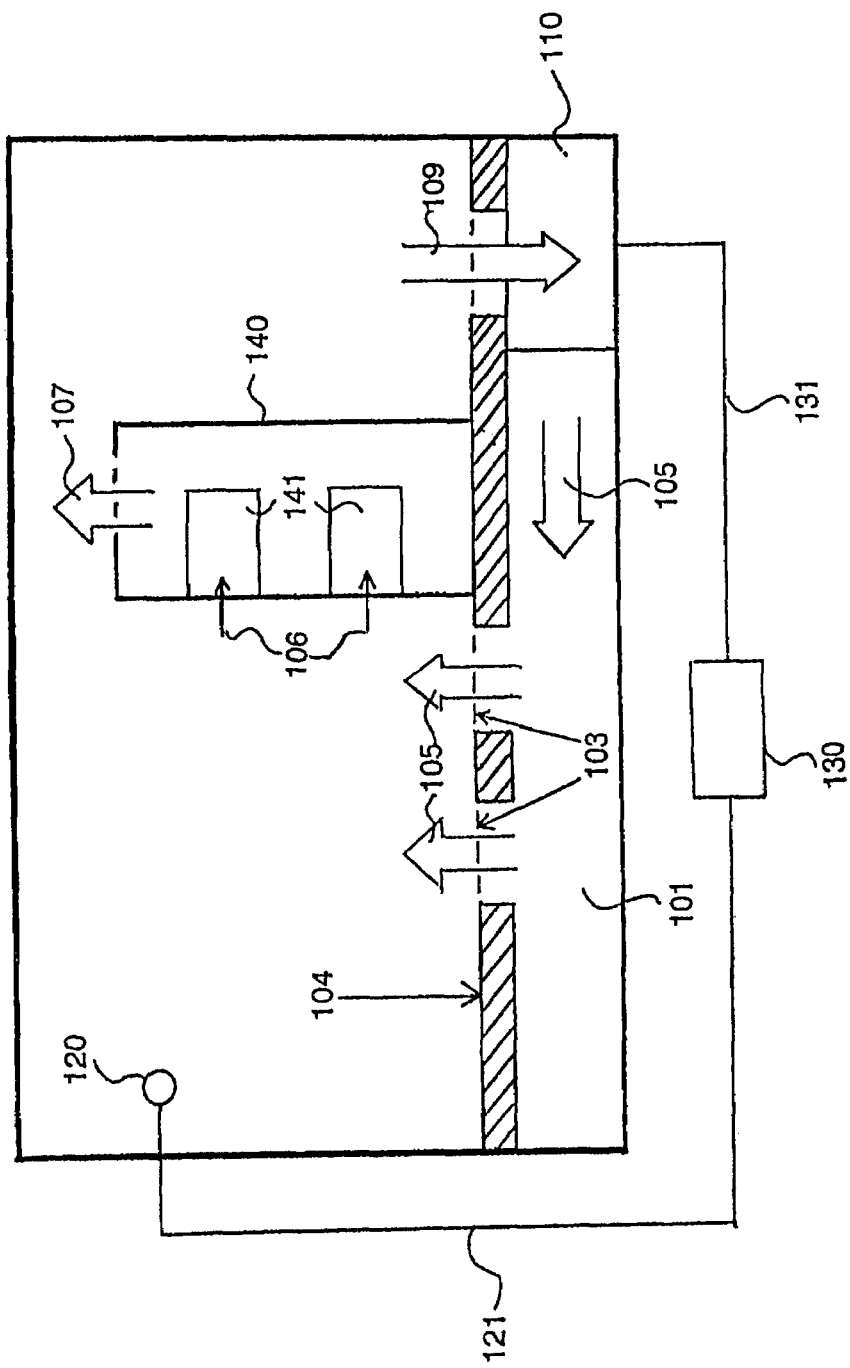
FIG. 1 is a plan view of an exemplary room for housing computer systems or other heat-producing devices showing a cooling system as described by the prior art.
Figure 2:
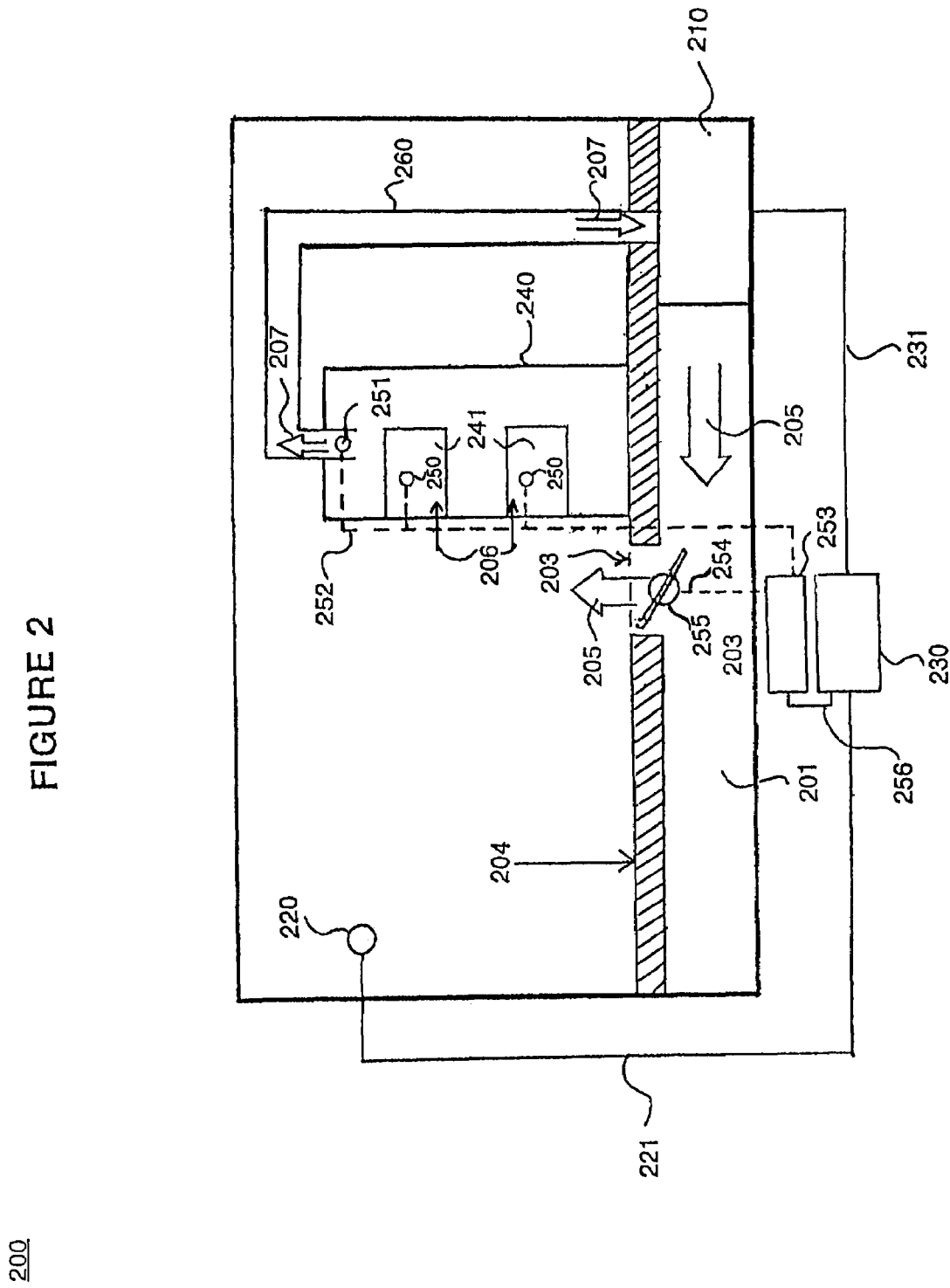
FIG. 2 is a plan view of an exemplary climate controlled environment for heat-producing devices in accordance with embodiments of the present invention.

FIG. 2 shows an exemplary climate controlled environment for electronic devices, such as servers in accordance with embodiments of the present invention. In FIG. 2, a room 200 contains a raised false floor 204. The raised false floor, in conjunction with the walls and lower floor of room 200, create an air flow plenum 201. The raised false floor 204 contains ports or openings 203 placed at predetermined locations on the floor throughout room 200 through which cooling air 205 flows from an air conditioner 210. In one embodiment of the present invention, some of the cooling air 205 (shown by arrows 206) enters through ports disposed within the front of the heat-producing devices 241 disposed within rack-mount housing 240. In embodiments of the present invention, the heat-producing devices 241 are computer components, servers, networking devices, etc. While the present embodiment recites these components specifically, embodiments of the present invention are well suited for cooling other electronic devices as well. Rack-mount housing 240 may contain a full complement of heat-producing devices 241, or any number of such devices, including none in embodiments of the present invention.

The heat from the heat-producing devices 241 is dissipated into the cooling air 206 and is conducted out of the rack-mount housing 240 as heated air (e.g., arrows 207 of FIG. 2). As shown in the embodiment of FIG. 2, heated air 207 is returned directly to air conditioner 210 from rack-mount housing 240 via a duct 260. This prevents heated air 207 from mixing with the cooling air 205 and/or the ambient air of room 200 and raising the ambient temperature of room 200. Air conditioner 210 comprises a heat exchanger that removes heat and dehumidifies the heated air 207 and recycles cooling air 205 into air plenum 201. In embodiments of the present invention, air conditioner 210 is a component of a room air conditioning system for room 200.

In the embodiment of FIG. 2, a localized temperature sensor 250 is disposed within or proximate to each of the heat-producing devices 241 mounted in rack-mount housing 240. Temperature sensor(s) 250 typically detect an over-temperature condition or fault for the particular heat-producing device 241 with which it is proximate. Also shown in FIG. 2 is a temperature sensor 251 that is disposed within the air flow of heated air 207 (e.g., disposed within duct 260) as it leaves rack-mount housing 240 in addition to the temperature sensors 250 that are disposed within or proximate to the heat producing devices. Typically, temperature sensor 251 is disposed in the path of heated air 207 as it leaves rack-mount housing 240 and detects the heat load generated by the heat-producing devices 241 disposed within rack-mount housing 240.

Temperature data from temperature sensor(s) 250 and/or temperature sensor 251 is conveyed to a local control subsystem 253 via signal path 252. In one embodiment, signal path 252 is implemented using a local area network, wherein each temperature sensor is a node in the network. While the present embodiment recites a local area network link specifically, embodiments of the present invention are well suited to utilize other communication media as well. For example, the temperature data signal may be conveyed directly from the temperature sensor(s) 250 and/or 251 via wires, without the use of any networking system. In one embodiment, power is supplied to the temperature sensors (e.g., temperature sensor(s) 250 and/or 251) from the local control subsystem 253. In other embodiments, power to the temperature sensors is supplied via rack-mount housing 240 or heat-producing device(s) 241.

Thermostat 220 comprises a temperature sensor and a control function for setting a reference temperature for the room. Temperature sensor data from thermostat 220 is conveyed via signal path 221 to a master control system 230, which interprets the data and the temperature setting and provides control signals via signal path 231 to air conditioner 210. Temperature sensor data from thermostat 220 and sensors 250 and/or 251 can be conveyed between local control subsystem 253 and master control system 230 via signal path 256. Thus, if more cooling air is needed to maintain a desired temperature within rack-mount housing 240, local control subsystem 253 can send a signal indicating this to master control system 230 via signal path 256.

The local control subsystem 253 derives a control signal based on the detected sensor input (e.g., from temperature sensor(s) 250 and/or 251) and the desired temperature level for that temperature sensor location. This type of local control subsystem, or controller, is known as a proportional controller and is well known in the control arts for heating/cooling systems. One suitable controller is manufactured by Johnson Controls Inc. of Milwaukee, Wis. and is described at:

http://cgproducts.johnsoncontrols.com/cat_pdf/
1922370.pdf.

A proportional controller creates a signal that is proportional to the difference between the actual temperature measured by the sensor and the temperature desired for the climate controlled environment (e.g., room 200). For example, a first voltage is generated based upon the actual temperature measured by the temperature sensor(s) and a second voltage is generated that is based upon the desired temperature. The larger the difference between the two voltages, the greater the level of the control signal generated by local control subsystem 253. As the actual temperature detected by the temperature sensor(s) approaches the desired temperature, the magnitude of the control signal decreases. In another embodiment, the temperature detected by temperature sensor 251 is subtracted from the temperature detected by a thermostat 220. The magnitude of the difference between the two temperatures determines the magnitude of the control signal sent by local control subsystem 253. In another embodiment, the temperature detected by temperature sensor 220 is subtracted from the temperature detected by temperature sensor 251 to determine the magnitude of the control signal sent by local control subsystem 253.

The control signal derived from the local control subsystem 253 is conveyed via signal path 254 to an air-flow control feature 255 which consists of a controllable, electro-mechanically actuated vane, also referred to as a "damper", which is located in the port(s) 203. In embodiments of the present invention, this may be implemented using, for example, a local area network connection as described above.

Air control feature 255 is used to regulate the amount of cooling air 205 enters room 200. In embodiments of the present invention, a larger control signal generated by local control subsystem 253 causes air-flow control feature 255 to create a larger opening in port 203 and thus deliver more cooling air 205 to room 200 in the vicinity of rack-mount housing 240. As a result, a greater amount of cooling air is available to cool the heat-producing devices 241. This in turn facilitates dissipating a greater amount of heat that is generated by the heat-producing devices 241. Alternatively, a smaller control signal generated by local control subsystem 253 causes air-flow control feature 255 to create a smaller opening in port 203 and thus deliver less cooling air 205 to room 200 in the vicinity of rack-mount housing 240. In embodiments of the present invention, to avoid oscillation, an integrator is employed to drive the difference between actual detected temperature and the desired temperature to zero.

As described above, cooling air 205 passes into the plenum 201 throughout the region underneath the false floor 204, and is available at port 203 for conveyance through the air-flow control feature 255. The vane in air-flow control feature 255 provides a means for controlling the volume of cooling air 205 delivered to room 200 and, in turn, the rack-mount housing 240. If rack-mount housing 240 is fully populated with heat-producing devices 241, then the control damper 255 is typically opened wider to permit a larger volume of cooling air 205 to enter room 200 in the vicinity of rack-mount housing 240. Thus, a greater amount of cooling air is available to be drawn into the heat-producing devices 240. Conversely, if the rack-mount housing 240 is lightly populated, then less cooling air 205 is needed to maintain a desired temperature, and the air-flow control feature 255 is typically opened less to restrict the flow of cooling air 205 into room 200. Exemplary remotely controllable dampers and actuators are described the online catalog of Johnson Controls Inc. of Milwaukee, Wis. as shown in their online catalog at:

http://www.johnsoncontrols.com/cg/html/what_we_offer.htm.

In another embodiment of the present invention, signal path 252 comprises a wireless communications link implemented either as a single wireless link, or as part of a wireless network that communicatively couples local control subsystem 253 with sensor(s) 250 and/or 251. In this embodiment, a local input/output (I/O) system can be use as an interface between the temperature sensor(s) and a wireless communications component. There are a variety of wireless communications systems that can be used in embodiments of the present invention. One such wireless communications system is compliant with the Institute of Electrical and Electronic Engineers (IEEE) Wireless Standard 802.11b. While the present embodiment explicitly recites the 802.11b standard, embodiments of the present invention are well suited to utilize other wireless communications systems such as, for example, a Bluetooth wireless communications network. In a similar manner, signal path 254 can be implemented as a wireless communications link.

In one embodiment, the rack-mount housing 240 may be coupled with air-flow control feature 255. For example, rack-mount housing 240 may be disposed above ports 203 and cooling air 205 enters rack-mount housing 240 directly from plenum 201. Alternatively, a duct (not shown) coupled with rack-mount housing 240 may conduct cooling air 205 directly from port 203 into rack-mount housing 240. Air-flow control feature 255 may also be coupled with rack-mount housing 240 to control the amount of cooling air entering the rack-mount housing.

Embodiments of the present invention facilitate controlling the flow of cooling air that is available to each rack-mount housing within room 200. As a result, the amount of cooling air entering room 200 in the vicinity of rack-mount housing 240 is based upon the heat load generated by the rack-mount housing rather than upon a more general measurement of the ambient temperature of the room. This is advantageous over prior room cooling solutions that did not account for variations in the heat load generated by the rack-mount housings individually. Additionally, the heated air is conveyed away from the rack-mount housing without heating the ambient air in room 200. As a result, greater cooling efficiency is realized using embodiments of the present invention.

Figure 3:
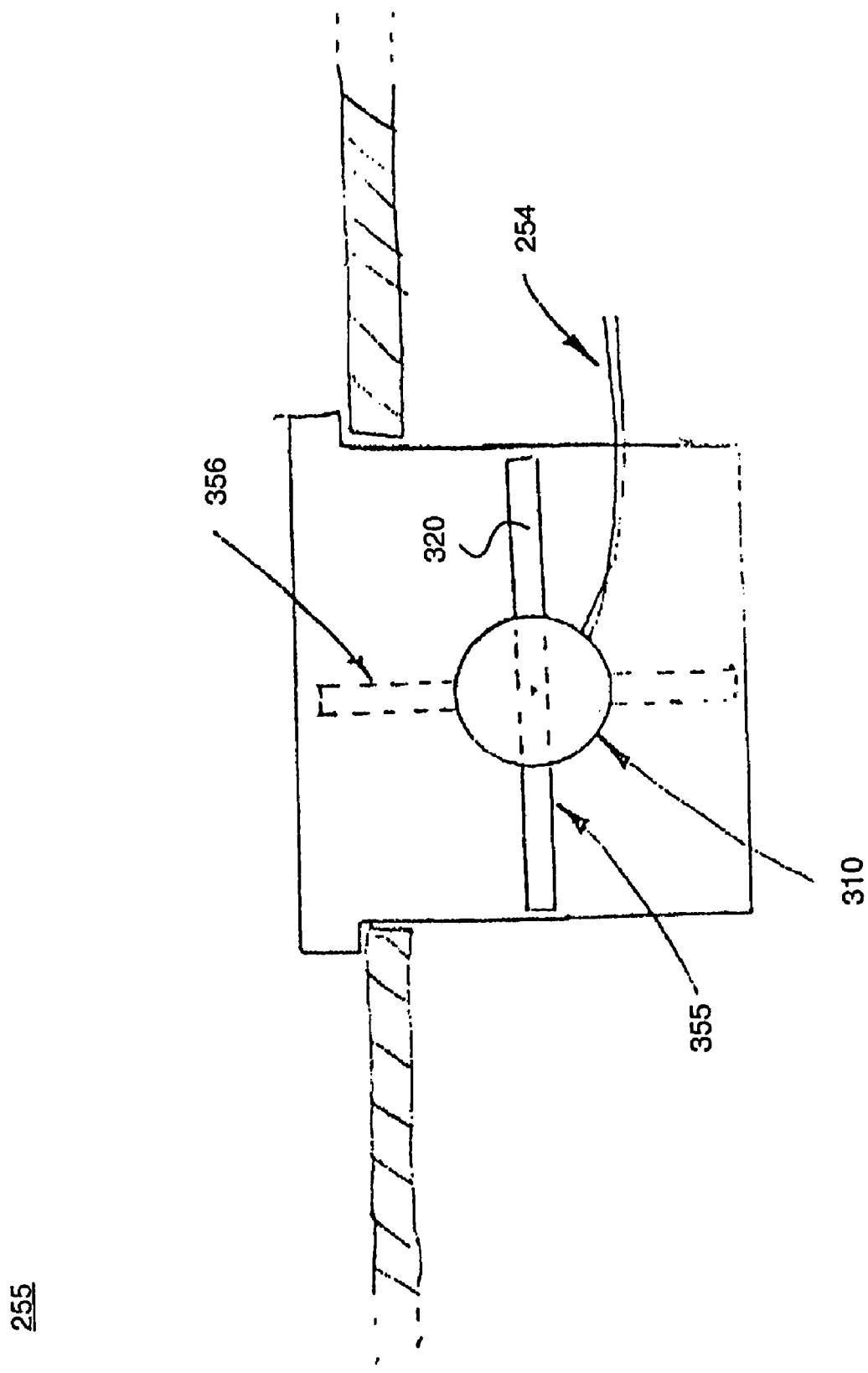
FIG. 3 is a cross section view of an air-flow control feature utilized in accordance with embodiments of the present invention.

FIG. 3 is a cross section view of an air-flow control feature (e.g., air-flow control feature 255 of FIG. 2) utilized in accordance with embodiments of the present invention and depicts a functional diagram of an air-flow control feature 255 with a damper 320 shown in a closed position 355, and in an open position at 356. Damper position is controlled by a stepper motor 310 in response to control signals from a local control subsystem (e.g., local control subsystem 253 of FIG. 2) via signal path 254. It is appreciated that an air-flow control feature of the present invention is well suited to position the damper 320 in other positions than only the open position 356 and closed position 355. In other words, damper 320 may be opened to a variety of intermediate positions between closed position 355 and open position 356.

In one embodiment, setting the desired temperature for room 200 is accomplished using an input device disposed proximate to the local control subsystem 253. In another embodiment, setting the desired temperature is accomplished from a remote location using a local area network or via a wired connection. Thus, a temperature setting function is performed either at the local control subsystem 253 or at a suitable remote location. Local control subsystem 253 can be located wherever convenient such as, for example, adjacent to the main air conditioning control system 210. In another embodiment, it is integrated into the main air conditioning control system 230.

Other implementations of air-flow control feature 255 may also be used in embodiments of the present invention. For example, a mechanically moveable, and controllable louver comprising a series of smaller vanes operating in tandem across the port 203 in FIG. 2, and mounted in a suitable housing. In another embodiment, air-flow control feature 255 may be implemented as a mechanically adjustable, controllable shutter in which a series of flat strips are moved across a series of matching openings.

Figure 4:
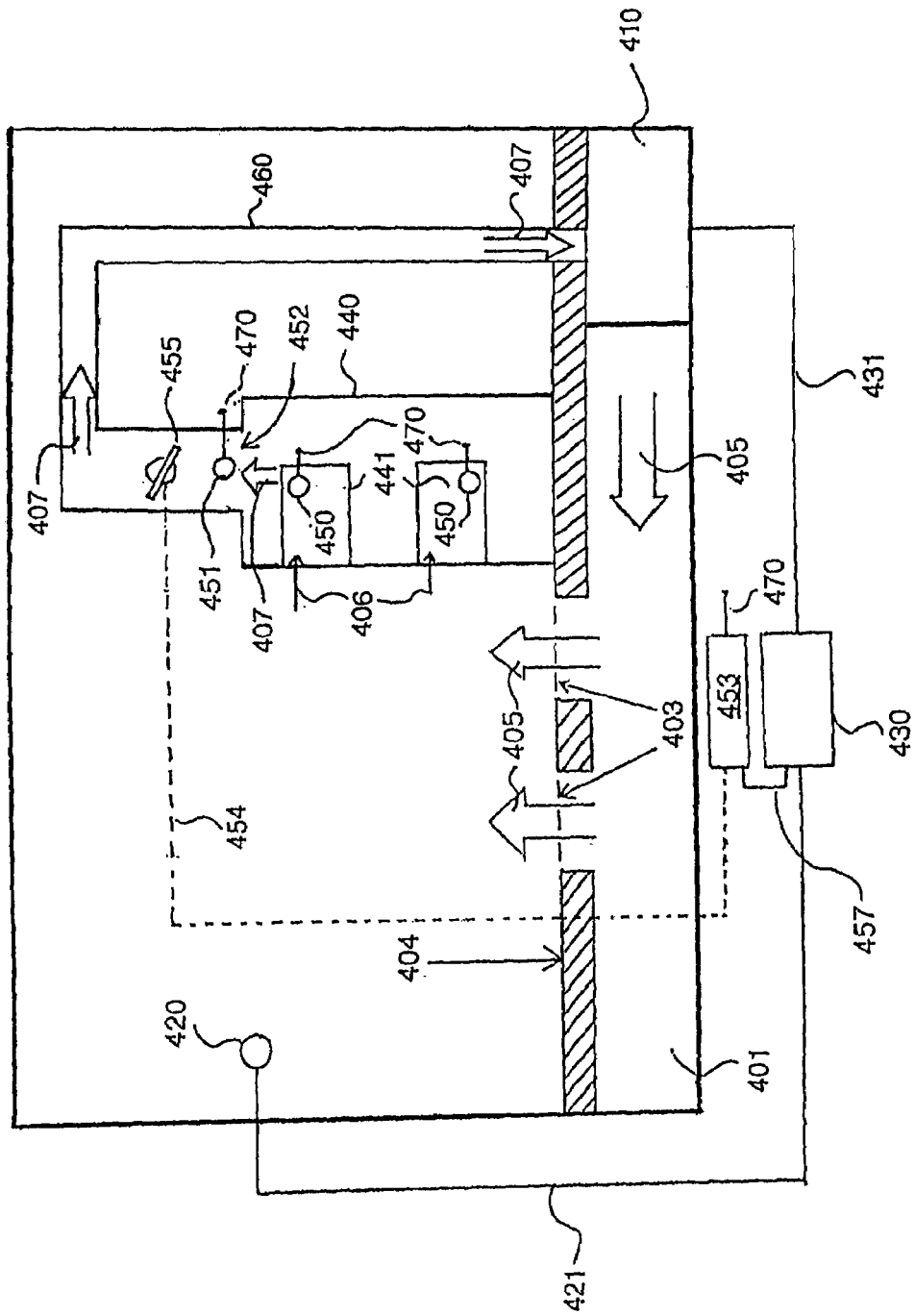
FIG. 4 is a plan view of an exemplary climate controlled environment for housing heat producing devices in accordance with embodiments of the present invention.

FIG. 4 is a plan view of an exemplary climate controlled environment for housing heat producing devices in accordance with embodiments of the present invention. In FIG. 4, a room 400 contains a raised false floor 404. The raised false floor, in conjunction with the walls and lower floor of room 400, create an air flow plenum 401. The raised false floor 404 contains ports or openings 403 placed at predetermined locations on the floor throughout the room, through which cooling air 405 flows from an air conditioner 410. Some of the cooling air 405 (shown by arrows 406) enters the heat-producing devices 441 mounted in rack-mount housing 440 through ports (not shown) disposed in the heat-producing devices. Heat from the heat-producing devices 441 is dissipated into the cooling air and is conducted away as heated air (e.g., as shown by arrows 407). In embodiments of the present invention, there may be any number of such rack-mount housings 440 in a given room. Rack-mount housing 440 may contain a full complement of heat-producing devices 441, or any number of such devices, including none.

In the embodiment of FIG. 4, a localized temperature sensor 450 is disposed within or proximate to each of the heat-producing devices 441 mounted in rack-mount housing 440. As described above, temperature sensor(s) 450 typically detect an over-temperature condition or fault for the particular heat-producing device 441 with which it is proximate. Also shown in FIG. 4 is a temperature sensor 451 that is disposed within the flow path of heated air 407 as it conducts heat out of rack-mount housing 440. Although the present embodiment shows temperature sensor 451 disposed within the flow path of heated air 407, embodiments of the present invention are well suited to have temperature sensor 450 disposed in other areas such as within rack-mount housing 440 as well. As shown in the embodiment of FIG. 4, heated air 407 is returned directly to air conditioner 410 from rack-mount housing 440 via a duct 460 that is coupled with rack-mount housing 440 and air conditioner 410. This prevents heated air 407 from mixing with the cooling air 405 and/or the ambient air of room 400 and raising the ambient temperature of room 400. Air conditioner 410 comprises a heat exchanger that removes heat and dehumidifies the returned air 407 and recycles cooling air 405 into air plenum 401. In embodiments of the present invention, air conditioner 410 is a component of a room air conditioning system for room 400.

Thermostat 420 comprises a temperature sensor and a control function for setting a reference temperature for room 400. Temperature sensor data from thermostat 420 is conveyed via signal path 421 to a master control system 430, which interprets the data and the temperature setting and provides control signals via signal path 431 to air conditioner 410. In one embodiment, the temperature sensor data from thermostat 420 can be conveyed to master control system 430 using a local area network or another communication medium.

In the embodiment of FIG. 4, a wireless communications link implemented either as a single wireless link, or as part of a wireless network that communicatively couples local control subsystem 453 with sensor(s) 450 and 451 via antennas 470. In this embodiment, a local input/output (I/O) system can be use as an interface between the temperature sensor(s) and a wireless communications component. There are a variety of wireless communications systems that can be used in embodiments of the present invention. One such wireless communications system is compliant with the Institute of Electrical and Electronic Engineers (IEEE) Wireless Standard 802.11b. While the present embodiment explicitly recites the 802.11b standard, embodiments of the present invention are well suited to utilize other wireless communications systems such as, for example, a Bluetooth wireless communications network.

While the present embodiment recites communicatively coupling temperature sensors 450 and 451 with local control subsystem 453 wirelessly, embodiments of the present invention are well suited to use other communication methods. For example, temperature data from temperature sensors 450 and 451 can be conveyed to a local control subsystem 453 via a local area network, wherein each temperature sensor is a node in the network. Alternatively, the temperature data signal may be conveyed directly from the temperature sensor(s) 420 and/or 451 via wires, without the use of any networking system. Temperature data can be conveyed between local control subsystem 453 and master control system 430 via, for example signal path 457. Thus, if local control subsystem 453 determines that excessive heat is being generated within rack-mount housing 440 (e.g., by heat-producing devices 441), a signal can be sent indicating this to master control system 430 via signal path 457. This initiates air conditioner 410 supplying more cooling air 405 which can then be drawn into the heat-producing devices 441.

The local control subsystem 453 of the temperature control subsystem derives a control signal based on the detected sensor input (e.g., from temperature sensor(s) 450 and/or 451) and the desired temperature level for that temperature sensor location. As described above, in embodiments of the present invention local control subsystem 453 is a proportional controller. The control signal derived from the local control subsystem 453 is delivered via signal path 454 to an air-flow control feature 455 which consists of a controllable, mechanically moveable vane, also referred to as a "damper", which is disposed within duct 460 which is coupled with rack-mount housing 240. Heated air 407 leaves rack-mount housing 440 via port 452 and is conveyed away from the rack-mount housing using duct 460. In embodiments of the present invention, the control signal to air-flow control feature 455 can be conveyed via a wireless link.

As described above, air control feature 455 is used to regulate the amount of heated air 407 that exits rack-mount housing 440. For example, a larger control signal generated by local control subsystem 453 causes air-flow control feature 455 to create a larger opening in duct 460 and thus allow more heated air 407 to flow out of rack-mount housing 440. As a result, a greater amount of cooling air can be drawn into the heat-producing devices 441 to facilitate cooling the devices. Alternatively, a smaller control signal generated by local control subsystem 453 causes air-flow control feature 455 to create a smaller opening in duct 460 and which results in less cooling air 406 entering heat-producing devices 441. In embodiments of the present invention, to avoid oscillation, an integrator is employed to drive the difference between actual detected temperature and the desired temperature to zero.

In one embodiment, the flow of cooling air into room 400 can be regulated as described above in the embodiment of FIG. 2. As a result, the flow of cooling air 405 in the vicinity of rack-mount housing 440 can be regulated by an air-flow control feature (e.g., air-flow control feature 255 of FIG. 2) disposed in port 403 in addition to the flow of heated air 407 being conveyed away from rack-mount housing 440. The control signals used to control air-flow control feature 255 and air-flow control feature 455 can be generated by local control subsystem 453 as discussed above.

Figure 5:
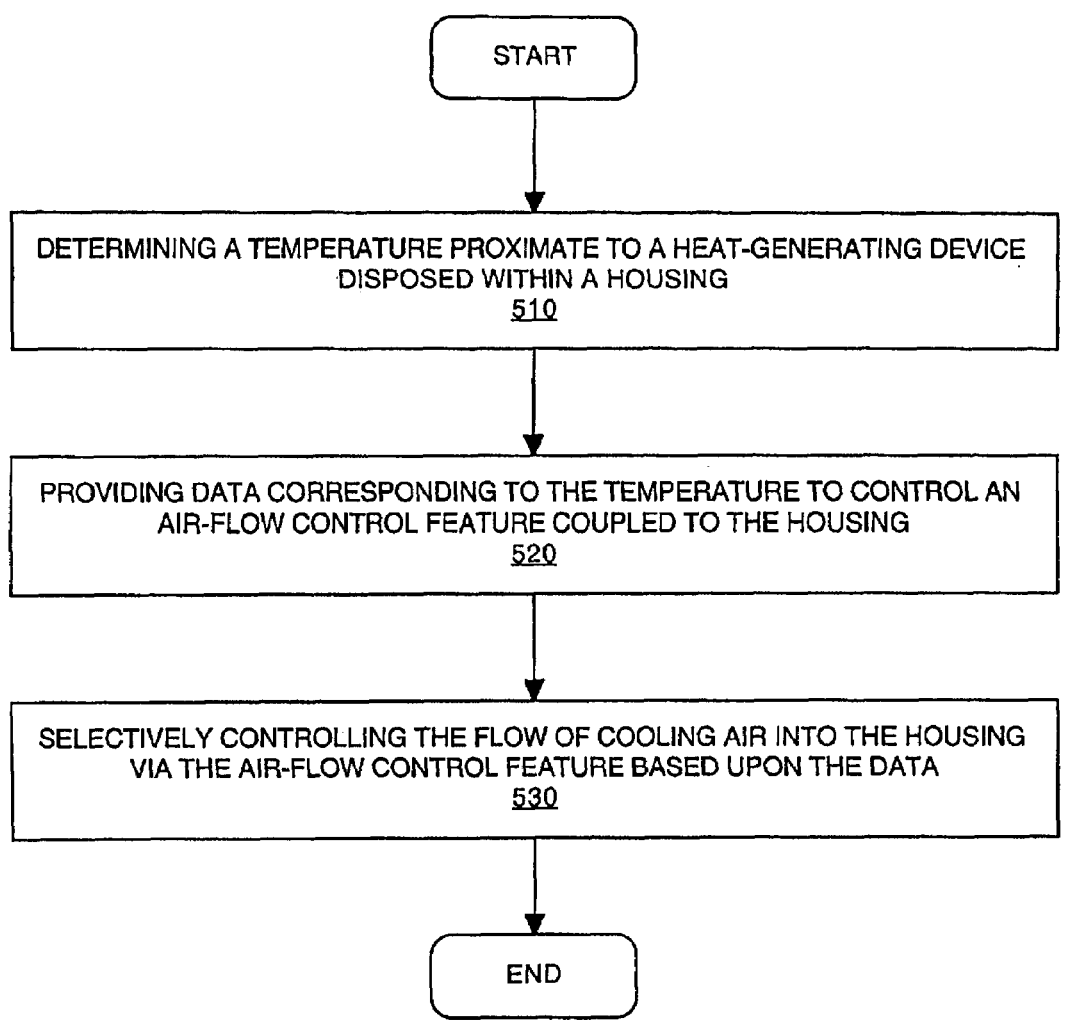
FIG. 5 is a flow chart of a method for controlling the temperature of a heat generating device in accordance with embodiments of the present invention.

FIG. 5 is a flow chart of a method 500 for controlling the temperature of a heat generating device in accordance with embodiments of the present invention. In step 510 of FIG. 5, a temperature proximate to a heat-generating device disposed within a housing is determined. Referring again to FIG. 2, temperature sensor(s) 250 detect the temperature of heat-generating devices 240 that are disposed within rack-mount housing 240. In the embodiment of FIG. 2, temperature sensor 251 detects the temperature of the heated air 207 as it exits rack-mount housing 240.

In step 520 of FIG. 5, data corresponding to the temperature proximate to the heat-generating device is provided to an air-flow control feature coupled to the housing. The temperature detected by temperature sensor(s) 250 and/or 251 detect the temperature proximate to the heat-generating device(s) 240 and within rack-mount housing 240 as a whole. This data is communicated via signal path 252 to local control subsystem 253 which generates a control signal for controlling air-flow control feature 255. Air-flow control feature 255 is for controlling the amount of cooling 205 that enters room 200. In embodiments of the present invention, every port 203 in room 200 through which cooling air passes is controlled by an air-flow control feature 255.

In step 530 of FIG. 5, the flow of cooling air to the rack-mount housing via the air-flow control feature is selectively controlled based upon the data. Depending upon the control signal generated by local control subsystem 253, air-flow control feature 255 can be electro-mechanically operated to allow a greater or lesser amount of cooling air to flow into room 200 in the vicinity of rack-mount housing 240. In so doing, a greater or lesser amount of cooling air is available to the heat-generating devices within rack-mount housing 240 depending upon the overall heat load generated by that particular rack-mount housing. Embodiments of the present invention are advantageous in that the amount of cooling air delivered in the vicinity of each rack-mount housing is directly correlated to the heat load generated by the heat-generating devices in the housing rather than the heat load of the room in general. This is advantageous in that cooling air is delivered selectively to particular regions of the room in which the heat load varies from the average heat load of the room in general.

FIG. 6 is a flow chart of a method 600 for controlling the temperature of an electrical device in accordance with embodiments of the present invention. In step 610 of FIG. 6, a duct for conveying air is coupled with a housing for an electrical device. Referring again to FIG. 4, duct 460 is coupled with rack-mount housing 440.

In step 620 of FIG. 6, data substantially corresponding to the temperature of heated air being conveyed from the housing is generated using a temperature sensor disposed within the duct. Referring again to FIG. 4, temperature sensor 451 is disposed within duct 460. Temperature sensor 451 is for detecting the temperature of heated air (e.g., heated air 407 of FIG. 4) that is conveyed out of housing 440 via duct 460.

In step 630 of FIG. 6, a control signal to an air-flow control feature disposed within the duct is generated in response to receiving the data. Referring again to FIG. 4, local control subsystem 453 generates a control signal to air-flow control feature 455 that is disposed within duct 460. As discussed above, the control signal is based upon the difference between the heat load generated by the electrical devices 441 disposed with the rack-mount housing 440 and a desired temperature.

In step 640 of FIG. 6, the flow of the heated air out of the housing is regulated using the air-flow control feature. Referring again to FIG. 4, air-flow control feature 455 is used to regulate the amount of heated air 407 that exits rack-mount housing 440. For example, a larger control signal generated by local control subsystem 453 causes air-flow control feature 455 to create a larger opening in duct 460 and thus allow more heated air 407 to flow out of rack-mount housing 440. As a result, a greater amount of cooling air can be drawn into the heat-producing devices 441 to facilitate cooling the devices. Alternatively, a smaller control signal generated by local control subsystem 453 causes air-flow control feature 455 to create a smaller opening in duct 460 and which results in less cooling air 406 entering heat-producing devices 441.

The present invention is advantageous in that the heated air from the electrical devices does not mix with the ambient air in the room in which the rack-mount housing is located. As a result, a substantial savings can be realized as the expense of cooling the entire room can be reduced. Additionally, using embodiments of the present invention the heat load generated within the rack-mount housings individually determines the amount of cooling air drawn into the rack-mount housings.

Various embodiments of the present invention, a method and apparatus for regulating the operating temperature of electronic devices, are thus described. While the present invention has been described in particular embodiments, it should be appreciated that the present invention should not be construed as limited by such embodiments alone, but rather construed according to the following claims.

What is claimed is:

1. A system for controlling the temperature of an electronic device comprising:
   a duct for conveying heated air away from an electrical device disposed within a housing, said duct preventing the heated air from mixing with the ambient air of a room in which said housing is disposed;
   a temperature sensor disposed within said duct for generating data substantially corresponding to the temperature of the heated air;
   a second temperature sensor disposed in said room for generating data substantially corresponding to the temperature of said room;
   an air-flow control feature disposed within said housing for regulating the amount of the heated air being conveyed away from said electrical device; and
   a local control subsystem coupled with said air-flow control feature and with said temperature sensors for controlling said air-flow control feature based upon the data received from said temperature sensors, wherein the amount of the heated air conveyed away from said electrical device is adjusted in response to a control signal generated by said local control subsystem.

2. The system of claim 1, wherein said duct is coupled with said housing.

3. The system of claim 1, wherein said duct conveys the heated air directly to an air conditioning system.

4. The system of claim 1, wherein said local control subsystem determines a value corresponding to the difference between the data generated by said temperature sensor and said second sensor.

5. The system of claim 4, wherein said control signal is generated in response to said value.

6. The system of claim 1, wherein said data and said control signal are conveyed to said local control subsystem via a wired link.

7. The system of claim 1, wherein said data and said control signal are conveyed to said local control subsystem via a wireless link.

8. A method for controlling the temperature of an electrical device comprising:
- coupling a duct for conveying heated air with a housing of an electrical device;
- generating data substantially corresponding to the temperature of heated air being conveyed from said housing using a temperature sensor disposed within said duct;
- generating data substantially corresponding to the temperature of a room in which said housing is disposed using a second temperature sensor;
- generating a control signal to an air-flow control feature disposed within said duct in response to receiving the data; and
- regulating the flow of the heated air out of said housing using said air-flow control feature.

9. The method as recited in claim 8, wherein said generating said control signal comprises comparing the data from said temperature sensor with the data from said second temperature sensor.

10. The method as recited in claim 8 further comprising:
- conveying the heated air out of said room to an air conditioning system.

11. The method as recited in claim 10, wherein said heated air does not mix with the ambient air of said room.

12. The method as recited in claim 8 further comprising:
- communicatively coupling said temperature sensor and said air-flow control feature with a local control subsystem for generating said control signal.

13. The method as recited in claim 12, wherein said temperature sensor and said air-flow control feature are communicatively coupled with said local control subsystem using a wired link.

14. The method as recited in claim 12, wherein said temperature sensor and said air-flow control feature are communicatively coupled with said local control subsystem using a wireless link.

* * * * *